US011460512B2

(12) United States Patent
O'Mahony

(10) Patent No.: US 11,460,512 B2
(45) Date of Patent: Oct. 4, 2022

(54) BATTERY MODULE TESTING

(71) Applicant: Analog Devices International Unlimited Company, Limerick (IE)

(72) Inventor: Shane O'Mahony, Grenagh (IE)

(73) Assignee: Analog Devices International Unlimited Company, Limerick (IE)

( * ) Notice: Subject to any disclaimer, the term of this patent is extended or adjusted under 35 U.S.C. 154(b) by 73 days.

(21) Appl. No.: 17/021,682

(22) Filed: Sep. 15, 2020

(65) Prior Publication Data

US 2021/0302507 A1   Sep. 30, 2021

Related U.S. Application Data

(60) Provisional application No. 62/994,652, filed on Mar. 25, 2020.

(51) Int. Cl.
*G01R 31/00* (2006.01)
*G01R 31/392* (2019.01)
*G01R 31/36* (2020.01)
*G01R 31/364* (2019.01)

(52) U.S. Cl.
CPC ....... *G01R 31/392* (2019.01); *G01R 31/3646* (2019.01); *G01R 31/364* (2019.01)

(58) Field of Classification Search
USPC ........................................ 324/426, 430–435
See application file for complete search history.

(56) References Cited

U.S. PATENT DOCUMENTS

| | | |
|---|---|---|
| 6,795,782 B2 | 9/2004 | Fritsch et al. |
| 8,125,193 B2 | 2/2012 | Page et al. |
| 9,461,320 B2 | 10/2016 | Ballantine et al. |
| 9,588,187 B2 | 3/2017 | Park |
| 10,386,422 B2 | 8/2019 | Christensen et al. |
| 2003/0206021 A1 | 11/2003 | Laletin et al. |

(Continued)

FOREIGN PATENT DOCUMENTS

| | | |
|---|---|---|
| CN | 104282965 B | 8/2016 |
| WO | 2021190930 | 9/2021 |

OTHER PUBLICATIONS

Roscher, Alentin, et al., "Synchronisation using Wireless Trigger-Broadcastfor Impedance Spectroscopy of Battery Cells", 2015 IEEE, (2015), 6 pages.

(Continued)

*Primary Examiner* — Vincent Q Nguyen
(74) *Attorney, Agent, or Firm* — Schwegman Lundberg & Woessner, P.A.

(57) ABSTRACT

Testing of a battery module can be conducted using monitoring electronics attached to the battery module. Stimulus can be applied to the battery module and removed. After removal of the stimulus, the monitoring electronics can collect signals from the monitoring electronics reflecting parameters of the battery module as it relaxes back to a non-stimulated state. The stimulus can be provided by test equipment or by components of a system in which the battery module, having attached monitoring electronics, is implemented. The monitoring electronics attached to the battery module can provide autonomous recording of signals associated with the battery module that can provide data regarding the status of the battery module or one or more batteries contained in the battery module.

20 Claims, 6 Drawing Sheets

(56) References Cited

U.S. PATENT DOCUMENTS

| | | |
|---|---|---|
| 2005/0218902 A1 | 10/2005 | Restaino et al. |
| 2007/0046261 A1* | 3/2007 | Porebski .......... G01R 31/3865 320/132 |
| 2010/0235024 A1* | 9/2010 | Uchida ................ H01M 10/42 701/22 |
| 2011/0270559 A1 | 11/2011 | Christophersen et al. |
| 2011/0301931 A1 | 12/2011 | Gering |
| 2013/0069660 A1 | 3/2013 | Bernard et al. |
| 2013/0093428 A1* | 4/2013 | Tinnemeyer ......... G01R 31/382 324/426 |
| 2016/0259015 A1* | 9/2016 | Carlo .................. G01R 31/382 |
| 2017/0219660 A1 | 8/2017 | Christensen et al. |
| 2017/0254859 A1 | 9/2017 | Christophersen et al. |
| 2019/0012091 A1 | 4/2019 | Ghantous et al. |
| 2019/0288520 A1 | 9/2019 | Abdel-monem et al. |
| 2019/0310215 A1 | 10/2019 | Ballantine et al. |
| 2019/0317152 A1 | 10/2019 | Ballantine et al. |

OTHER PUBLICATIONS

"International Application Serial No. PCT/EP2021/056043, International Search Report dated Jun. 15, 2021", 5 pgs.

"International Application Serial No. PCT/EP2021/056043, Written Opinion dated Jun. 15, 2021", 7 pgs.

Knauff, Michael, "A platform for the testing and validation of dynamic battery models", IEEE Electric Ship Technologies Symposium, (Apr. 20, 2009), 554-559.

Lashway, Christopher R, "Adaptive Battery Management and Parameter Estimation Through Physics-Based Modeling and Experimental Verification", IEEE Transactions on Transportation Electrification, 2(4), (Dec. 2016), 454-464.

Pattipati, Bharath, "System Identification and Estimation Framework for Pivotal Automotive Battery Management System Characteristics", IEEE Transactions on Systems, Man, and Cybernetics—Part C: Applications and Reviews, 41(6), (Nov. 2011), 869-884.

* cited by examiner

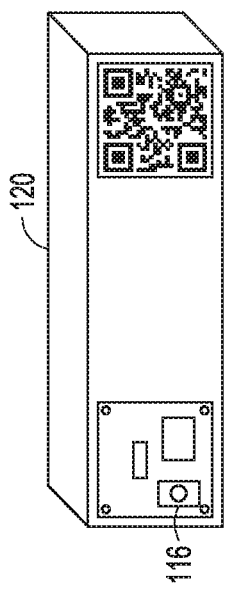
FIG. 4
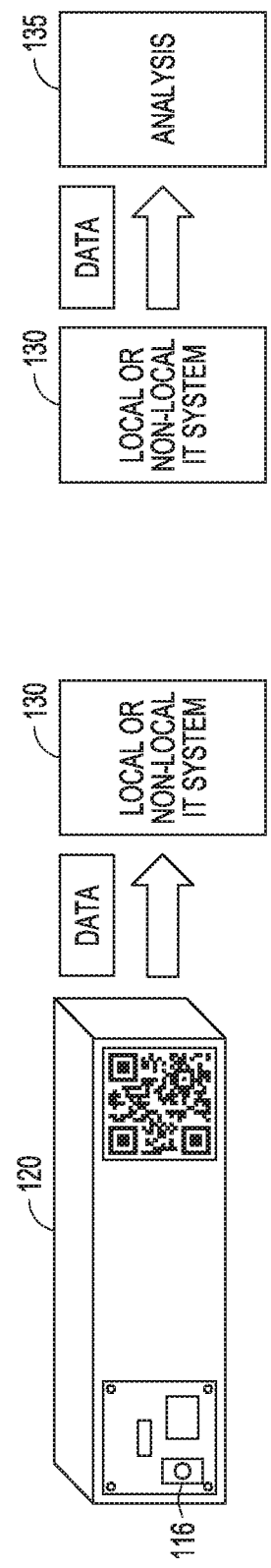
FIG. 5
FIG. 6

BATTERY MODULE TESTING

PRIORITY APPLICATION

This application claims the benefit of priority to U.S. Provisional Application Ser. No. 62/994,652 filed 25 Mar. 2020, which is incorporated herein by reference in its entirety.

FIELD OF THE DISCLOSURE

This document relates to measurement apparatus and methods and, in particular, to battery measurement apparatus and methods.

BACKGROUND

Electrical impedance spectroscopy (EIS) is a measurement of electrochemical impedance. Electrochemical impedance is usually measured by applying an AC (alternating current) signal, such as a sinusoidal test voltage or current, to an electrochemical cell under test and then measuring the current through the electrochemical cell. EIS uses measurement of impedance over a suitable frequency range. This can provide a useful technique to investigate the electrical properties of a large variety of materials and devices such as batteries.

With batteries placed in a module, which can subsequently be placed as power sources in apparatus, EIS testing after module creation is typically not executed today. In conventional procedures to weed out bad battery units, battery module voltage is measured, the battery module is stored for a number of weeks, and then battery voltage is remeasured. If the drop in voltage is abnormal, the battery is omitted. Advances in techniques of battery measurement can enhance battery technology and its application.

SUMMARY OF THE DISCLOSURE

A device having a structure to measure one or more parameters of a battery module or one or more batteries of the battery module can be implemented in a variety of applications. Testing of a battery module can be conducted using monitoring electronics attached to the battery module, with a stimulus applied to the battery module and removed. After removal of the stimulus, the monitoring electronics can collect signals from the monitoring electronics reflecting parameters of the battery module as it relaxes back to a non-stimulated state. The stimulus can be provided by test equipment or by components of a system in which the battery module, having attached monitoring electronics, is implemented. The monitoring electronics attached to the battery module can provide autonomous recording of signals associated with the battery module that can provide data regarding the status of the battery module or one or more batteries contained in the battery module.

For example, in certain embodiments, a method of battery testing can be provided that discloses: applying a stimulus to a battery module, the battery module having one or more batteries; turning off use of the battery module including removing the stimulus to the battery module; after turning off use of and removing the stimulus to the battery module, autonomously recording signals from the battery module using monitoring electronics attached to the battery module; and outputting the recorded signals from which one or more electrochemical parameters or one or more electrical parameters of the battery module or the one or more batteries arranged in the battery module are calculated using the recorded signals.

In certain embodiments, a system can be provided that discloses: a battery module having one or more batteries; monitoring electronics attached to the battery module, the monitoring electronics to monitor response of a battery of the battery module to a stimulus applied to the battery; and a controller configured to perform operations, the operations including: turning off use of the battery module including removing the stimulus to the battery module; after turning off use of and removing the stimulus to the battery module, autonomously recording signals from the battery module using the monitoring electronics; and outputting the recorded signals from which one or more electrochemical parameters or one or more electrical parameters of the battery module or the one or more batteries arranged in the battery module are calculated using the recorded signals.

In certain embodiments, a system can be provided that discloses: a battery module having one or more batteries; a means to monitor a response of a battery of the battery module to a stimulus applied to the battery; a means to autonomously record signals from the battery module in response to the means to monitor the response of the battery identifying the turning off of the battery module including removal of the stimulus to the battery; and a means to output the recorded signals from which one or more electrochemical parameters or one or more electrical parameters of the battery module or the one or more batteries arranged in the battery module are calculated using the recorded signals.

BRIEF DESCRIPTION OF THE DRAWINGS

The drawings illustrate generally, by way of example, but not by way of limitation, various embodiments discussed herein. The drawings are not necessarily drawn to scale.

FIGS. 1-6 illustrate a flow of an example method of battery module testing using battery test equipment as stimulus and autonomous recording of measurement signals via electronics attached to the battery module, in accordance with various embodiments.

DETAILED DESCRIPTION

In various embodiments, battery module EIS measurement can be realized using battery test equipment as stimulus and autonomous recording of voltage via electronics attached to the module. This measurement method can execute EIS analysis of the battery by the combination of battery test equipment and autonomous battery monitoring. The use of autonomous measurement allows the battery to be tested at high volume quickly, then moved to storage where the monitoring can continue for a relatively long period.

An example measurement procedure on a battery module can be conducted in the following manner. Stimulus to the battery module can be applied via test equipment. Such test equipment can include, but is not limited to, battery module end of line test equipment. After completion of the application of the stimulus, the battery module is removed from the test equipment. Using electronics attached to the battery module, one or more of voltage, temperature, and impedance is recorded autonomously. The electronics can measure the battery module periodically to save energy. The measurement electronics can be powered by the battery module. The known stimulus and the recorded parameters can be used to calculate electrochemical parameters or other parameters of the battery module or one or more of the batteries. In various embodiments, autonomous measurement of the battery module is made in reaction to a stimulus provided by test equipment. The autonomous measurement can be conducted after the stimulus is applied and after removal from being coupled to the test equipment. This is a superior procedure to conventional use of test equipment to measure battery parameters, as the battery reaction to the stimulus typically requires a long settling time. It is not efficient to hold the test equipment to a given battery module during the settling time. For example, for an automotive assembly line for electric vehicle battery modules, test time should be very short. Autonomous measurement, as taught herein, allows the measurement to continue offline, freeing up the equipment. Other assembly lines can be implemented in a similar manner for battery modules for other apparatus having a battery-based electric function. A vehicle can include, but is not limited to, a truck, a bus, a ship, an airplane, a bike, a robot, a train, or other instrumentality that moves as part of its function.

Figure 1:
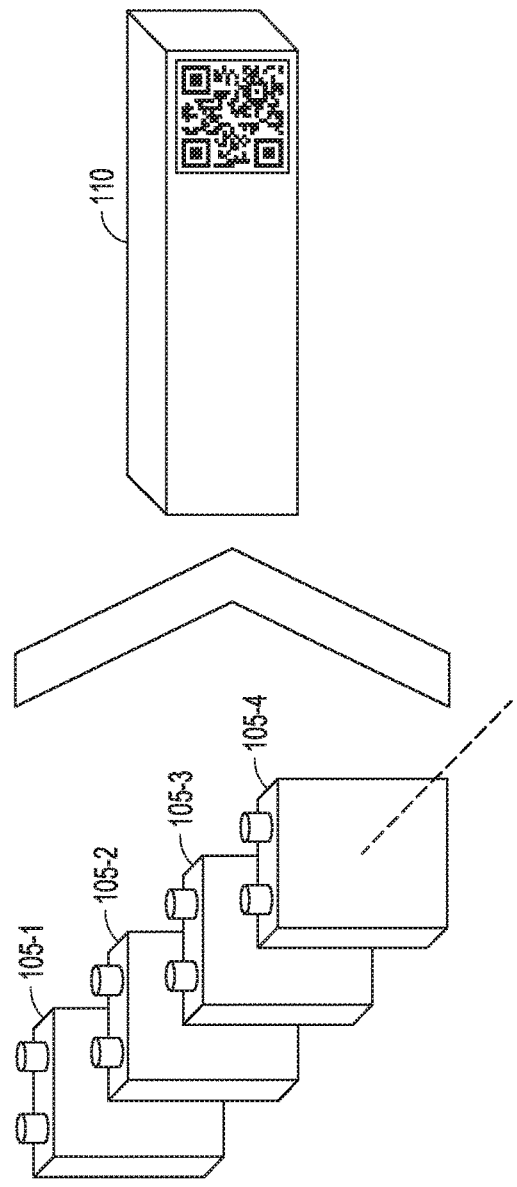

FIGS. 1-6 illustrate an embodiment of a flow of an example method of battery module testing using battery test equipment to provide stimulus and autonomous recording of measurement signals via electronics attached to the battery module. The battery module testing can include electrochemical impedance spectroscopy measurement. FIG. 1 illustrates a point in the manufacture flow at which one or more battery cells 105-1, 105-2, 105-3, and 105-4 are formed into a battery module 110. Battery modules can contain more or less than four battery cells.

Figure 2:
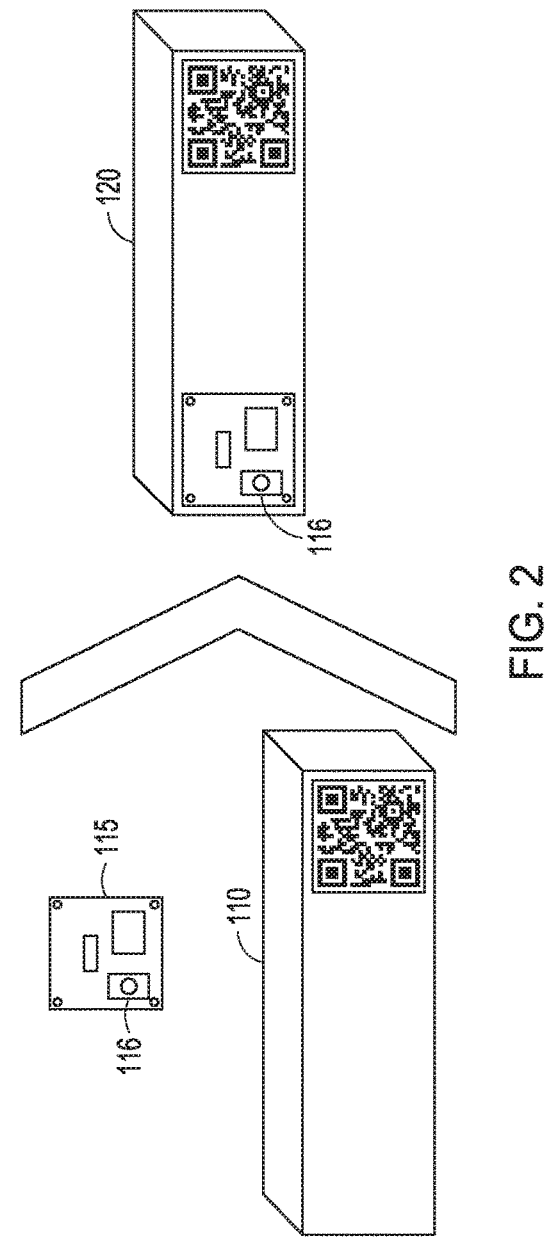

FIG. 2 illustrates a point in the manufacture flow at which cell monitoring electronics 115 are added to battery module 110 to form a battery module 120 having monitoring electronics. The monitoring electronics 115 are electrically coupled to the battery module 110 and the one or more battery cells 105-1, 105-2, 105-3, and 105-4 to make measurements of these structures. The monitoring electronics 115 can include a wireless communication device 116 to transmit data measured or signals collected by the monitoring electronics 115. The measured data or the collected signals can be sent to a device or system exterior to the battery module 120. Monitoring electronics 115 can be implemented as one or more cell monitoring electronic units attachable to the one or more battery cells 105-1, 105-2, 105-3, and 105-4 formed into a battery module 110. In this example method, the cell monitoring electronics is capable of autonomously measuring some electrical parameters of the battery module 120 having monitoring electronics, or the one or more battery cells 105-1, 105-2, 105-3, and 105-4. For example, battery cell voltage, temperature, or impedance can be measured.

Figure 3:
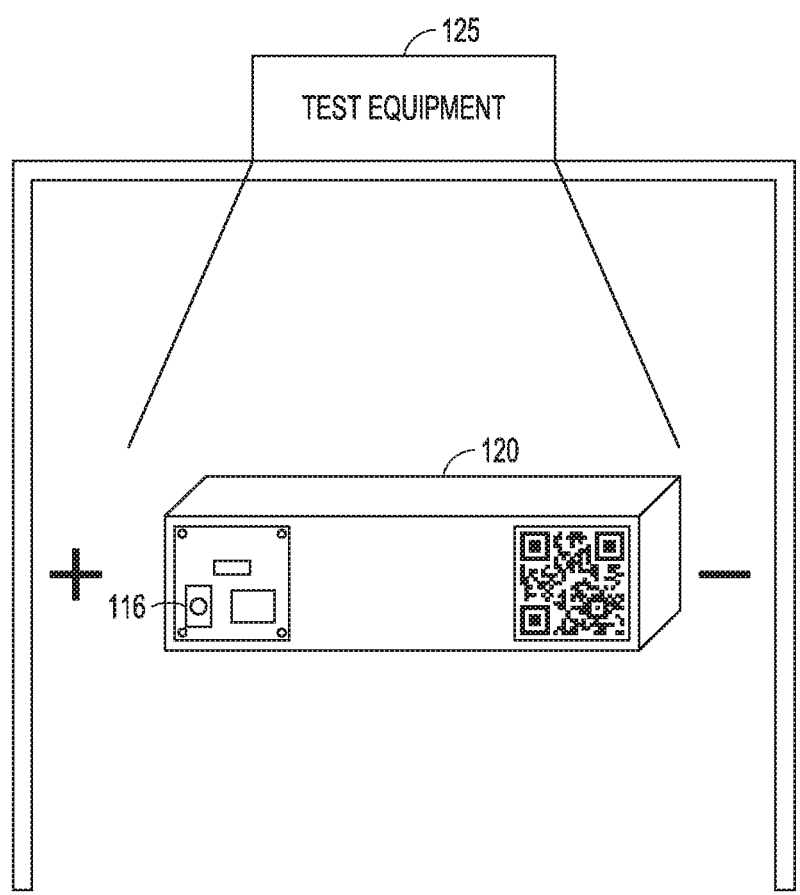

FIG. 3 illustrates a point in the manufacture flow at which the battery module 120 having monitoring electronics is stimulated by manufacturing test equipment 125. The manufacturing test equipment 125 can be high-volume manufacturing test equipment. Standard manufacturing test equipment can be used to provide the stimulus. The battery module 120 having monitoring electronics can be charged and/or discharged at least once. This stimulation by the manufacturing test equipment is known, measured, or can be inferred.

FIG. 4 illustrates a point in the manufacturing method at which the applied stimulus is removed from the battery module 120 having monitoring electronics. At this point, the monitoring electronics 115 autonomously records battery electrical signals. For example, this autonomous measurement can be made during transport or storage of the battery module 120 having monitoring electronics. Such transport or storage can be separate from inclusion in an application apparatus.

Because of the application of the stimulus, the battery module 120 having monitoring electronics has been excited and can take several hours to relax back to its natural state. The monitoring electronics 115, during the relaxation period, can keep measuring electrical parameters of the battery module 120 autonomously and keep recording signals from which these electrical parameters are derived. The battery module 120 can be shipped to a warehouse, with the cell monitoring electronics 115 continuing to carry out these autonomous measurements until the battery is completely or substantially relaxed, which could take, for example, 12 to 24 hours or longer. The autonomous measurements can be controlled by one or more processing devices and memory contained within monitoring electronics 115. The monitoring electronics 115 can be capable of measuring individual batteries of the battery module 120.

FIG. 5 illustrates a point in the method at which the recorded signals in the monitoring electronics 115 can be transmitted to a receiving device wirelessly or retrieved from memory of the monitoring electronics 115 later. The receiving device can be a local information technology (IT) system or a non-local IT system 130 such as, but not limited to, a cloud-based IT system. The IT systems can include data processing systems, information systems, recordkeeping systems, communications systems, telecommunications systems, account management systems, inventory management systems, other processing-based systems, and Internet websites, all which can be electronic or opto-electronic based systems. Such systems include associated computer programs, software, databases, firmware, hardware, and related documentation. The wireless transmission can be conducted using any one of a number of wireless transmission protocols. In some embodiments, the wireless communication can be conducted using a transmission protocol suited for a range of 5 to 10 meters. However, the wireless transmission is not limited to a range of 5 to 10 meters. In some embodiments in which data is retrieved from the memory of the monitoring electronics at a later time, the data transmission can be made via wired connections such as, but not limited to, universal serial bus (USB) connections. Short range wireless communications and USB connections can be coupled to one or more communications networks, which can include a local area network (LAN) or a wide area network (WAN).

FIG. 6 illustrates a point in the method at which EIS characteristics of the battery module 120 or one or more battery cells of the battery module 120 are calculated at the local IT system or the non-local IT system 130 providing an analysis 135. The characteristics can be EIS characteristics. Such calculations can be based on the recorded data by the monitoring electronics 115, as illustrated in FIG. 4, and known stimulus provided from test equipment 125, as illustrated in FIG. 3. The stimulus and the relaxation of the battery module 120 provides some of the electrochemical parameters of the battery module 120. The measured reaction to the stimulus over the relaxation time period allows the EIS parameters of the battery module 120 to be modeled in the analysis 135 in the IT system 130. These parameters and modelling can be conducted on an individual battery basis in addition to the modeling of the battery module 120 as a single unit. During the measurement over the relaxation period, the stimulus of the manufacturing test equipment 120 is not being provided to the battery module. In some embodiments, a portion of the analysis of the measurement data can be conducted in the monitoring electronics 115.

The process taught in FIGS. 1-6 includes measuring properties of a battery module or one or more batteries in the battery module by applying a stimulus to the battery module and measuring signals from the battery module after the stimulus has been removed with the battery module in a state in which it is not being actively used. The measuring signals can be collected before the batteries of the battery module relax to a relaxed state, where a normal relaxed state is associated with battery module not in use. The measured battery module can be stored for later use in various applications.

A similar process can be used in a variety of applications, where a battery module is stimulated, and electrical signals are collected from the battery module with the stimulus removed and the battery module not being actively used in the application. In these applications, the stimulus can be provided by monitoring electronics using a small amount of power from the battery module with the respective application not using the battery module. In some applications having multiple battery modules, one battery module can be tested with stimulus provided by another one of the battery modules. For example, applications not using the battery module can include an application that has idle periods or periods of being on and off. The off periods of such applications can provide an opportunity to test a battery module or one or more batteries of the battery module as the battery module or the one or more batteries transition through a relaxation period.

Figure 7:
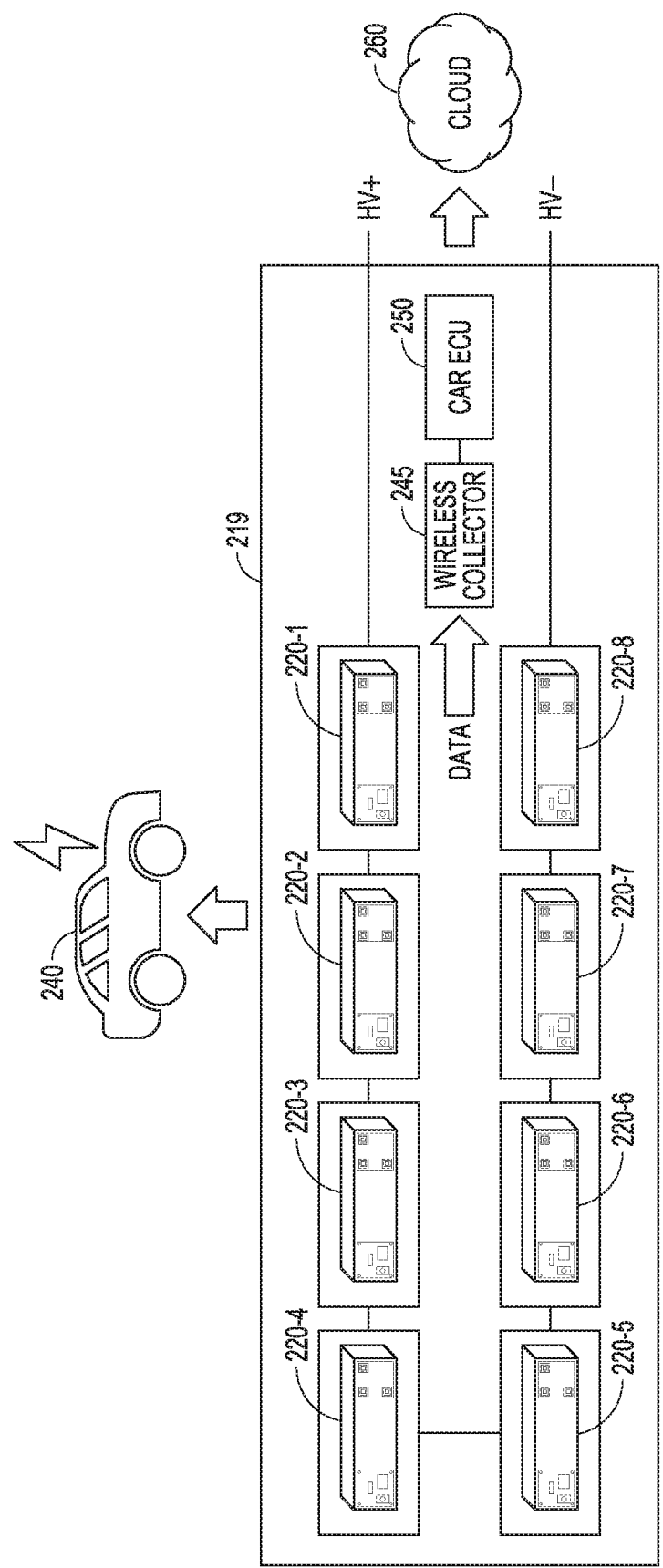
FIG. 7 illustrates an example battery pack in a car, in accordance with various embodiments.

FIG. 7 illustrates an embodiment of an example battery pack 219 in a car 240. The car 240 can be an electric car. The battery pack 219 can include a battery module 220-1, a battery module 220-2, a battery module 220-3, a battery module 220-4, a battery module 220-5, a battery module 220-6, a battery module 220-7, and a battery module 220-8. The battery pack 219 can have more or less than eight battery modules. The battery modules 220-1, 220-2, 220-3, 220-4, 220-5, 220-6, 220-7, and 220-8 can be connected in series with terminals HV+ and HV− to provide operating power for the car 240. Each of the battery modules 220-1, 220-2, 220-3, 220-4, 220-5, 220-6, 220-7, and 220-8 can be structured as a battery module having monitoring electronics similar to, but not limited to, the battery module 120 having monitoring electronics of FIG. 4.

As the car 240 drives, the battery modules 220-1, 220-2, 220-3, 220-4, 220-5, 220-6, 220-7, and 220-8 in the pack 219 are excited. When the car 240 is turned off, monitoring electronics on the battery modules 220-1, 220-2, 220-3, 220-4, 220-5, 220-6, 220-7, and 220-8 can measure battery parameters. Monitoring electronics on the battery modules 220-1, 220-2, 220-3, 220-4, 220-5, 220-6, 220-7, and 220-8 can measure battery parameters even if a BMS (battery management system) controller of the vehicle is turned off or in a state where it is not capable of issuing commands to the monitoring electronic. The monitor electronic can be capable of measuring autonomously. The measured parameters can include such parameters as voltage, temperature, and impedance. Signals for these parameters can also be collected in an automotive BMS system of the car 240. Monitoring electronics on the battery modules 220-1, 220-2, 220-3, 220-4, 220-5, 220-6, 220-7, and 220-8 can send data to an engine control unit (ECU) 250 for the car 240, wirelessly or wired. This data can be sent when the vehicle or the BMS controller is turned on again. An ECU is an internal computer of a car, which monitors and reacts to changes that occur in the systems of the car. Wireless data transfer to the ECU 250 can be implemented using a wireless collector 245. The wireless collector 245 can be connected to the ECU 250 via a wired connection or a wirelessly. In some instances when the car 240 is off, the car ECU 250 can be woken up by the monitoring electronics of one or more of the battery modules 220-1, 220-2, 220-3, 220-4, 220-5, 220-6, 220-7, and 220-8 or by the wireless collector 245. The data can be processed in the car 240 or sent to a cloud 260 for processing. The data can be stored in the BMS of the car 240 for access at a later date, such as at a standard maintenance inspection.

Typically, the term "cloud" with respect to data processing and communicating refers to a datacenter full of servers that is connected to the Internet. However, cloud may refer to any network or combinations of networks. A cloud can include a wide area network (WAN) like the public Internet or a private, national or global network, and may include a local area network (LAN) within an organization providing the services of the datacenter. In addition, the term "cloud computing" refers to the software and services executed for users by these servers, and typically the user is unaware of the physical location of the servers or datacenter. Further, the datacenter may be a distributed entity. Cloud computing can provide shared computer processing resources and data to computers and other devices on demand over associated networks.

EIS analysis can include processing of the data collected by the monitoring electronics of a battery module to detect an anomaly. An anomaly for a battery module can be data for a battery of the battery module that is different from data for the other batteries of the battery module. An anomaly for a battery module can be data of a parameter that differs significantly from past data of the parameter for the battery module. An anomaly can be a reaction, by the battery module or one or more batteries of the battery module to the stimulus, that is abnormal.

EIS analysis can include processing of the data collected by the monitoring electronics of a battery module to determine hidden states of the battery module, state of charge (SOC), and a state of health (SOH) of the battery module. The EIS analysis can be applied to small and large battery modules, such as but not limited to, for example, large battery modules or groups of large battery modules used in electric vehicles. Hidden states of the battery are states that are difficult to measure directly. The hidden states can be determined based on the measured data and a database that converts observable data to hidden states. Measurements and determined hidden states with respect to voltage and temperature can be used in one or more algorithms to calculate SOC and SOH, and to evaluate whether or not the batteries and battery modules are at a safe operating temperature.

EIS analysis can include processing of the data collected by the monitoring electronics of a battery module to model the battery module or one or more batteries of the battery module based on the observed data collected by the monitoring electronics of the battery module. The modelling can include creating a small signal electrical model. The electrical model can be interrogated to generate relevant impedances. Hidden states of the battery, SOC, and SOH can be determined based on the generated impedances and a database, where the database can be used to convert one or more impedances to hidden states.

The processed data collected by the monitoring electronics of a battery module can be used in a number of different ways. The processed data can be used to provide an alert regarding battery degradation and to characterize battery health. For example, with battery modules having monitoring electronics used in a car, as discussed with respect to FIG. 7, in response to a determination of battery degradation, an alert of the battery degradation can be generated on a display within the car. The characterization of the health of the battery module or its batteries can also be generated on a display within the car. Display of battery degradation and health can be used in applications other than in a car.

The processed data can be used to in a manufacturing application. In response to a determination that one or more battery modules have an anomaly, an anomalous battery module can be removed from a supply chain. The processed data can be used in an inventory system to grade and sort the battery modules based on processing the data from battery testing as taught herein.

Figure 8:
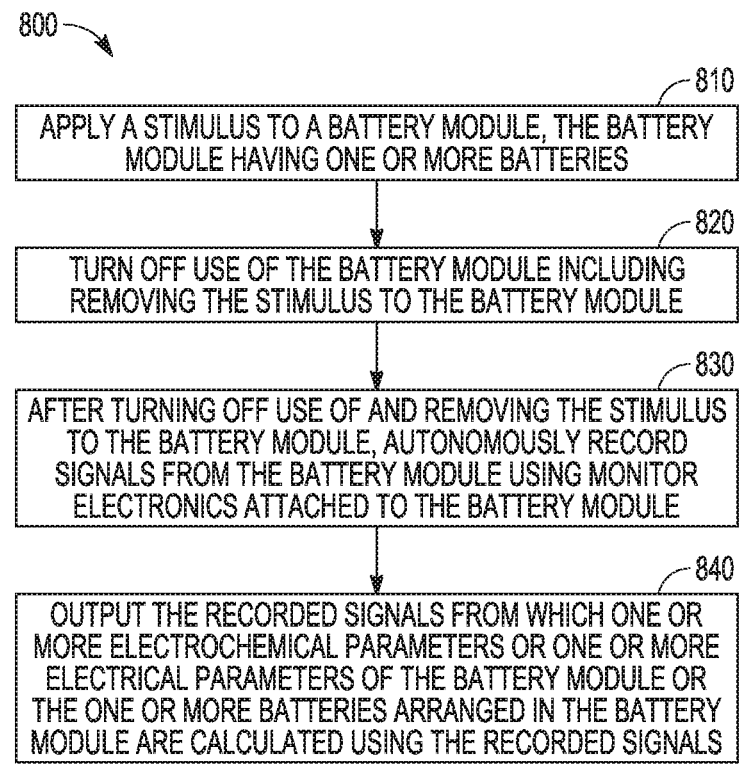
FIG. 8 is a flow diagram of features of an example method of battery testing, in accordance with various embodiments.

FIG. 8 is a flow diagram of features of an embodiment of an example method 800 of battery testing. At 810, a stimulus is applied to a battery module, where the battery module has one or more batteries. At 820, use of the battery module is turned off, including removing the stimulus to the battery module. At 830, after turning off use of and removing the stimulus to the battery module, signals from the battery module are autonomously recorded using monitoring electronics attached to the battery module. Autonomously recording the signals from the battery module can include recording voltage, temperature, or impedance of the battery module or the one or more batteries. The signals from the battery module can be autonomously recorded during a period including from turning off use of and removing the stimulus to the battery module to completion or substantial completion of relaxation of the battery module from applying the stimulus. The autonomous recording of the signals can be conducted continuously or periodically during this period. The completion of the relaxation of the battery module from applying the stimulus can be the turning on of a next use of the battery module, such as for example in a car or other apparatus that operates with period of on and off. Monitoring signals can also be collected during use of the battery module.

At 840, the recorded signals are output, from which one or more electrochemical parameters or one or more electrical parameters of the battery module or the one or more batteries arranged in the battery module are calculated using the recorded signals. The recorded signals can be transmitted wirelessly to a receiving device to analyze data from the recorded signals. The one or more electrochemical parameters or the one or more electrical parameters of the battery module or the one or more batteries arranged in the battery module can be calculated using a processing device coupled to the receiving device. Alternatively, this calculation can be conducted in conjunction with the monitoring electronics. Electrochemical Impedance Spectroscopy characteristics of the battery module or the one or more of the batteries can be calculated based on data from the recorded signals and the stimulus.

Variations of method 800 or methods similar to the method 800 can include a number of different embodiments that may be combined depending on the application of such methods and/or the architecture of systems in which such methods are implemented. Such methods can comprise applying the stimulus to the battery module to include applying the stimulus to the battery module using test equipment; and turning off use of the battery module including removing the stimulus to the battery module from the test equipment. The one or more batteries can be formed into the battery module before applying the stimulus to the battery module or to the one or more batteries. Applying the stimulus to the battery module using the test equipment can include charging and discharging the one or more batteries of the battery module. Signals from the battery module can be autonomously recorded during a period including from removal of the battery module from coupling to the test equipment to completion or substantial completion of relaxation of the battery module from applying the stimulus. The recorded signals can be retrieved from memory of the monitoring electronics at a time after removal from coupling to test equipment and after the battery module has relaxed from the applied stimulus. The recorded signals can be retrieved from the monitoring electronics and wirelessly transmitted to analysis apparatus.

Variations of method 800 or methods similar to the method 800 can comprise applying the stimulus to the battery module to include exciting the battery module with the battery module operable in a car, with the exciting enabled with the car in an on-status; and turning off use of the battery module including removing the stimulus to the battery module with the turning off of the car. Method 800 or methods similar to the method 800 can be applied to other apparatus that operate on battery power, where the apparatus goes through periods of being on and off. These on and off periods allow testing of a battery module or individual battery during a relaxation period after the stimulus of being on is removed.

Variations of method 800 or methods similar to the method 800 can include detecting an anomaly from the recorded signals; or determining a hidden state of the battery module or one or more of the batteries based on the recorded signals and a database that converts observable data to hidden states. Variations can include modelling the battery module or one or more of the batteries based on the recorded signals, including creating an electrical model; interrogating the electrical model; generating impedances from the interrogating of the electrical model; and determining a hidden state of the battery module or one or more of the batteries, based on the generated impedances and a database that converts impedances to hidden states.

Variations of method 800 or methods similar to the method 800 can include processing the recorded signal to provide, to a display, a characterization of health of the battery. In response to a determination of battery degradation, the processing can include generating an alert of the battery degradation. Variations can include processing the recorded signals, to provide, to a display, a quality grade of the battery module. In response to a determination of an anomaly associated with the battery module, an identification of the battery module being an anomalous battery module can be generated.

In various embodiments, a non-transitory machine-readable storage device, such as a computer-readable non-transitory medium, can comprise instructions stored thereon, which, when performed by a machine, cause the machine to perform operations, where the operations comprise one or more features similar to or identical to features of methods and techniques described with respect to method 800, variations thereof, and/or features of other methods or functions taught herein such as associated with FIGS. 1-9. The physical structures of such instructions may be operated on by one or more processors. Executing these physical structures can cause the machine to perform a variety of operations.

A non-transitory machine-readable medium storing instructions for testing a battery module, that when executed by one or more processors, can cause a system to perform operations comprising: applying a stimulus to a battery module, the battery module having one or more batteries; turning off use of the battery module including removing the stimulus to the battery module; after turning off use of and removing the stimulus to the battery module, autonomously recording signals from the battery module using monitoring electronics attached to the battery module; and outputting the recorded signals from which one or more electrochemical parameters or one or more electrical parameters of the battery module or the one or more batteries arranged in the battery module are calculated using the recorded signals. The operations can include controlling application of the stimulus to the battery module using test equipment and turning off use of the battery module and removing the stimulus to the battery module by removing the stimulus from and communication with the test equipment. The operations can include recording voltage, temperature, or impedance of the one or more batteries. The operations can include autonomously recording the signals from the battery module during a period including from turning off use of and removing the stimulus to the battery module to completion of relaxation of the battery module from applying the stimulus.

The instructions can be executed by the one or more processors to perform operations to transmit the recorded signals wirelessly to a receiving device to analyze data from the recorded signals. The operations can also include retrieving the recorded signals from memory of the monitoring electronics at a time after removal from coupling to test equipment providing the stimulus and after the battery module has relaxed from the applied stimulus. The operations can include calculating Electrochemical Impedance Spectroscopy characteristics of the battery module or the one or more of the batteries based on data from the recorded signals and the stimulus.

Variations of the operations executable by the one or more processors can include a number of different embodiments that may be combined depending on the application of such non-transitory machine-readable storage devices and/or the architecture of systems in which such non-transitory machine-readable storage device are implemented. Such operations can include applying the stimulus to the battery module to excite the battery module with the battery module operable in a car, with the exciting enabled with the car in an on-status; and turning off use of the battery module including removing the stimulus to the battery module with the turning off of the car. Variations of the operations executable by the one or more processors can be applied to other apparatus that operate on battery power, where the apparatus goes through periods of being on and off. These on and off periods allow testing of a battery module or individual battery during a relaxation period after the stimulus of being on is removed.

Variations of the operations can include detecting an anomaly from the recorded signals or determining a hidden state of the battery module or one or more of the batteries based on the recorded signals and a database that converts observable data to hidden states. Variations of the operations can include modelling the battery module or one or more of the batteries based on the recorded signals, including creating an electrical model; interrogating the electrical model; generating impedances from the interrogating of the electrical model; and determining a hidden state of the battery module or one or more of the batteries, based on the generated impedances and a database that converts impedances to hidden states.

In various embodiments, a system can comprise: a battery module having one or more batteries; monitoring electronics attached to the battery module, the monitoring electronics to monitor response of a battery of the battery module to a stimulus applied to the battery; and a controller configured to perform operations. The operations can include: turning off use of the battery module including removing the stimulus to the battery module; after turning off use of and removing the stimulus to the battery module, autonomously recording signals from the battery module using the monitoring electronics; and outputting the recorded signals from which one or more electrochemical parameters or one or more electrical parameters of the battery module or the one or more batteries arranged in the battery module are calculated using the recorded signals.

Variations of such a system can include a number of different embodiments that may be combined depending on the application of such systems and/or the architecture in which such systems are implemented. Such systems can include test equipment to provide the stimulus to the battery. The signals autonomously recorded signals can be voltage, temperature, or impedance of the one or more batteries. Such systems can include a transmitter to transmit the recorded signals wirelessly to a receiving device to analyze data from the recorded signals.

Variations of such systems can include the controller being operable to autonomously record signals from the battery module during a period including from turning off use of and removing the stimulus to the battery module to completion of relaxation of the battery module from applying the stimulus. Such systems can include a processing device configured to perform operations, where the operations include: modelling the battery module or one or more of the batteries based on the recorded signals, including creating an electrical model; interrogating the electrical model; generating impedances from the interrogating of the electrical model; and determining a hidden state of the battery module or one or more of the batteries, based on the generated impedances and a database that converts impedances to hidden states. Such systems can be implemented to perform the functions of methods and techniques described with respect to method 800, variations thereof, methods similar to method 800, and/or features of other methods or functions taught herein.

In various embodiments, a system can comprise: a battery module having one or more batteries; a means to monitor a response of a battery of the battery module to a stimulus applied to the battery; a means to autonomously record signals from the battery module in response to the means to monitor the response of the battery identifying the turning off of the battery module including removal of the stimulus to the battery; and a means to output the recorded signals from which one or more electrochemical parameters or one or more electrical parameters of the battery module or the one or more batteries arranged in the battery module are calculated using the recorded signals. Autonomously recording the signals from the battery module can occur during a period including from turning off use of and removing the stimulus to the battery to completion of relaxation of the battery from applying the stimulus.

Variations of such a system can include a number of different embodiments that may be combined depending on the application of such systems and/or the architecture in which such systems are implemented. Such systems can include a means to process the recorded signals, with the means to process the recorded signals being operable to provide, to a display, a characterization of health of the battery including, in response to a determination of battery degradation, an alert of the battery degradation. Variations of such systems can include a means to process the recorded signals, with the means to process the recorded signals being operable to provide, to a display, a quality grade of the battery module including, in response to a determination of an anomaly associated with the battery module, an identification of the battery module being an anomalous battery module. Such systems can be implemented to perform the functions of methods and techniques described with respect to method 800, variations thereof, methods similar to method 800, and/or features of other methods or functions taught herein.

Figure 9:
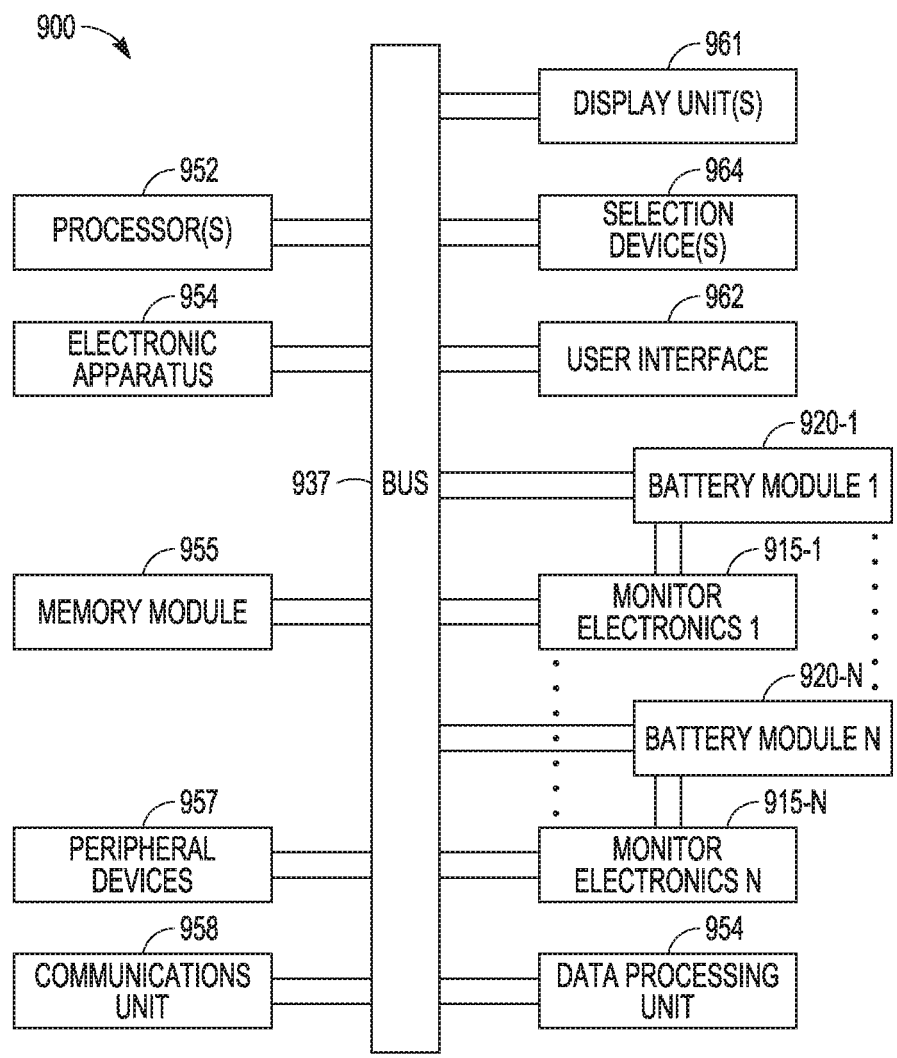
FIG. 9 is a block diagram of features of an example system having battery modules with monitoring electronics attached to the battery modules, in accordance with various embodiments.

FIG. 9 is a block diagram of features of an embodiment of an example system 900 having battery modules 920-1 . . . 920-N. The system 900 includes monitoring electronics 915-1 . . . 915-N attached to battery modules 920-1 . . . 920-N, respectively. The battery modules 920-1 . . . 920-N having monitoring electronics 915-1 . . . 915-N can be implemented in a number of apparatus that use one or more battery modules with each battery module having one or more batteries. The monitoring electronics 915-1 . . . 915-N can be used in testing battery modules 920-1 . . . 920-N, as taught herein. Data collected by the monitoring electronics 915-1 . . . 915-N can be used to keep track of SOC, SOH, voltage parameters, temperature, or combinations thereof of the battery modules 920-1 . . . 920-N or one or more batteries contained in the battery modules 920-1 . . . 920-N. The battery modules 920-1 . . . 920-N and the monitoring electronics 915-1 . . . 915-N can be implemented in electric vehicles, vehicles having a battery-based electric function, or other apparatus. A vehicle can include a truck, a bus, a ship, an airplane, a bike, a robot, a train, or other instrumentality that moves as part of its function.

System 900 can be a networked system in which the battery modules 920-1 . . . 920-N having monitoring electronics 915-1 . . . 915-N, respectively, can be located in a manufacturing storage region after testing of the battery modules 920-1 . . . 920-N or in an apparatus powered by one or more batteries. The battery modules 920-1 . . . 920-N having monitoring electronics 915-1 . . . 915-N can be implemented similar to battery module 120 having monitoring electronics of FIG. 4 or battery module 220-j, j=1, 2, . . . 8 having monitoring electronics of FIG. 7, but not limited to eight battery modules.

System 900 may also include a number of components such as one or more processors 952, memory module 955, communications unit 958, data processing unit 954, electronic apparatus 954, peripheral devices 957, display unit(s) 961, user interface 962, and selection device(s) 964. The one or more processors 952 may operate as a single processor or a group of processors. Processors of the group of processors may operate independently depending on an assigned function. One or more processors 952 can be realized in one or more application-specific integrated circuits (ASICs). One or more processors 952 may be realized in one or more digital signal processors (DSPs). In controlling operation of the components of system 900 to execute schemes associated the functions for which system 900 is designed, one or more processors 952 can direct access of data to and from a database.

System 900 can include one or more processors 952, memory module 955, and communications unit 958 arranged to operate as a processing unit to control management of the battery modules 920-1 . . . 920-N having monitoring electronics 915-1 . . . 915-N. In addition, for example, the one or more processors 952, memory module 955, and communications unit 958 can be arranged to adjust operating parameters of the battery modules 920-1 . . . 920-N having monitoring electronics 915-1 . . . 915-N. Depending on the application, communications unit 958 may use combinations of wired communication technologies and wireless technologies.

Memory module 955 can include a database having information, algorithms, and other data such that system 900 can operate on data from battery modules 920-1 . . . 920-N having monitoring electronics 915-1 . . . 915-N. The database can include information that converts observable data to hidden states. The database can include information that converts impedances generated from modelling to hidden states. Algorithms stored in memory module 955, including algorithms for computations and modeling, can be used to extract SOC, SOH, temperature, and hidden states of the battery modules 920-1 . . . 920-N having monitoring electronics 915-1 . . . 915-N. Theses computation and modeling algorithms can include a number of different known algorithms. Data processing unit 954 can be implemented as a standalone unit to determine SOC, SOH, temperature, and hidden states or data processing unit 954 may be distributed among the components of system 900 including memory module 955 and/or electronic apparatus 954.

Bus 937 provides electrical conductivity among the components of system 900. Bus 937 may include a number of different communication channels. For local use with battery modules 920-1 . . . 920-N, bus 937 may include an address bus, a data bus, and a control bus, where each may be independently configured. Bus 937 may be realized using a number of different communication mediums that allow for the distribution of components of system 900. Use of bus 937 can be regulated by one or more processors 952. Bus 937 may be operable as part of a communications network to transmit and receive signals including data signals and command and control signals. Bus 937 can be implemented as a distributed bus, including a wireless communication link, for overall operation of system 900 having a number of sub-systems.

In various embodiments, peripheral devices 957 may include drivers to provide voltage and/or current output from battery modules 920-1 . . . 920-N having monitoring electronics 915-1 . . . 915-N, additional storage memory, or other control devices that may operate in conjunction with the one or more processors 952 or memory module 955.

Display unit(s) 961 can be arranged with a screen display that can be used with instructions stored in memory module 955 to implement user interface 962 to manage the operation of battery modules 920-1 . . . 920-N having monitoring electronics 915-1 . . . 915-N and/or components distributed within system 900. Display unit(s) 961 can display information regarding battery modules 920-1 . . . 920-N or one or more batteries contained in these modules, where the information is acquired through monitoring battery modules 920-1 . . . 920-N during relaxation periods of these battery modules. Such information can include, but is not limited to, one or more of an alert of battery degradation, a quality grade of the battery module, and a characterization of health of the battery. Such a user interface can be operated in conjunction with communications unit 958 and bus 937. Display unit(s) 961 can include a video screen or other structure to visually project data/information and images. System 900 can include a number of selection devices 964 operable with user interface 962 to provide user inputs to operate data processing unit 954 or its equivalent. Selection device(s) 964 can include a touch screen or a selecting device operable with user interface 962 to provide user inputs to operate data processing unit 954 or other components of system 900.

System 900 can be implemented as test equipment with battery modules 920-1 . . . 920-N having monitoring electronics 915-1 . . . 915-N being the workpiece on which such test equipment operates. System 900 can be implemented as test equipment such as test equipment 125 of FIG. 3. System 900 can be implemented, at least in part, in apparatus such as, but not limited to, electric vehicles, vehicles having a battery-based electric function, or other apparatus having off periods of battery use.

The following are example embodiments of systems and methods of operation, in accordance with the teachings herein.

An example system 1, having a structure to measure a battery, can comprise: a battery module having one or more batteries; monitoring electronics attached to the battery module, the monitoring electronics to monitor response of a battery of the battery module to a stimulus applied to the battery; and a controller configured to perform operations, the operations including: turning off use of the battery module including removing the stimulus to the battery module; after turning off use of and removing the stimulus to the battery module, autonomously recording signals from the battery module using the monitoring electronics; and outputting the recorded signals from which one or more electrochemical parameters or one or more electrical parameters of the battery module or the one or more batteries arranged in the battery module are calculated using the recorded signals.

An example system 2, having a structure to measure a battery, can include features of example system 1 and can include test equipment to provide the stimulus to the battery.

An example system 3, having a structure to measure a battery, can include features of any of the preceding example systems and can include autonomously recording signals to include recording voltage, temperature, or impedance of the one or more batteries.

An example system 4, having a structure to measure a battery, can include features of example system 3 or features of any of the preceding example systems and can include the controller being operable to autonomously record signals from the battery module during a period including from turning off use of and removing the stimulus to the battery module to completion of relaxation of the battery module from applying the stimulus.

An example system 5, having a structure to measure a battery, can include features of example system 3 or features of any of the preceding example systems and can include a transmitter to transmit the recorded signals wirelessly to a receiving device to analyze data from the recorded signals.

An example system 6, having a structure to measure a battery, can include features of any of the preceding example systems and can include a processing device configured to perform operations, the operations including: modelling the battery module or one or more of the batteries based on the recorded signals, including creating an electrical model; interrogating the electrical model; generating impedances from the interrogating of the electrical model; and determining a hidden state of the battery module or one or more of the batteries, based on the generated impedances and a database that converts impedances to hidden states.

In an example system 7, any apparatus associated with the example systems 1 to 6 may further include a machine-readable storage device configured to store instructions as a physical state, wherein the instructions may be used to perform one or more operations of the apparatus and systems.

In an example system 8, any of the example systems 1 to 7 may be operated in accordance with any of the methods of the following example methods 1 to 17.

In an example system 9, having a structure to measure a battery, can comprise: a battery module having one or more batteries; a means to monitor a response of a battery of the battery module to a stimulus applied to the battery; a means to autonomously record signals from the battery module in response to the a means to monitor the response of the battery identifying the turning off of the battery module including removal of the stimulus to the battery; and a means to output the recorded signals from which one or more electrochemical parameters or one or more electrical parameters of the battery module or the one or more batteries arranged in the battery module are calculated using the recorded signals.

An example system 10, having a structure to measure a battery, can include features of example system 9 and can include the means to autonomously record signals from the battery module to include autonomously recording signals from the battery module during a period including from turning off use of and removing the stimulus to the battery to completion of relaxation of the battery from applying the stimulus.

An example system 11, having a structure to measure a battery, can include features of any of the preceding example systems 9 and 10 and can include a means to process the recorded signals, with the means to process the recorded signals being operable to provide, to a display, a characterization of health of the battery including, in response to a determination of battery degradation, an alert of the battery degradation.

An example system 12, having a structure to measure a battery, can include features of any of the preceding example systems 9 to 11 and can include a means to process the recorded signals, with the means to process the recorded signals being operable to provide, to a display, a quality grade of the battery module including, in response to a determination of an anomaly associated with the battery module, an identification of the battery module being as anomalous battery module.

In an example system 13, any apparatus associated with the example systems 9 to 12 may further include a machine-readable storage device configured to store instructions as a physical state, wherein the instructions may be used to perform one or more operations of the apparatus and systems.

In an example system 14, any of the example systems 9 to 12 may be operated in accordance with any of the methods of the following example methods 1 to 17.

An example method 1 of battery testing can comprise: applying a stimulus to a battery module, the battery module having one or more batteries; turning off use of the battery module including removing the stimulus to the battery module; after turning off use of and removing the stimulus to the battery module, autonomously recording signals from the battery module using monitoring electronics attached to the battery module; and outputting the recorded signals from which one or more electrochemical parameters or one or more electrical parameters of the battery module or the one or more batteries arranged in the battery module are calculated using the recorded signals.

An example method 2 of battery testing can include features of example method 1 and can include applying the stimulus to the battery module includes applying the stimulus to the battery module using test equipment; and turning off use of the battery module including removing the stimulus to the battery module includes removing the stimulus to the battery module from the test equipment.

An example method 3 of battery testing can include features of any of the preceding example methods and can include applying the stimulus to the battery module using the test equipment to include charging and discharging the one or more batteries of the battery module.

An example method 4 of battery testing can include features of any of the preceding example methods and can include autonomously recording signals from the battery module to occur during a period including from removal of the battery module from coupling to the test equipment to completion of relaxation of the battery module from applying the stimulus.

An example method 5 of battery testing can include features of any of the preceding example methods and can include retrieving the recorded signals from memory of the monitoring electronics at a time after removal from coupling to test equipment and after the battery module has relaxed from the applied stimulus.

An example method 6 of battery testing can include features of any of the preceding example methods and can include calculating the one or more electrochemical parameters or the one or more electrical parameters of the battery module or the one or more batteries arranged in the battery module.

An example method 7 of battery testing can include features of any of the preceding example methods and can include the one or more batteries being formed into the battery module before applying the stimulus to the battery module or to the one or more batteries.

An example method 8 of battery testing can include features of any of the preceding example methods and can include autonomously recording signals to include recording voltage, temperature, or impedance of the one or more batteries.

An example method 9 of battery testing can include features of any of the preceding example methods and can include autonomously recording signals includes recording signals periodically.

An example method 10 of battery testing can include features of any of the preceding example methods and can include autonomously recording signals from the battery module to occur during a period including from turning off use of and removing the stimulus to the battery module to completion of relaxation of the battery module from applying the stimulus.

An example method 11 of battery testing can include features of any of the preceding example methods and can include transmitting the recorded signals wirelessly to a receiving device to analyze data from the recorded signals.

An example method 12 of battery testing can include features of any of the preceding example methods and can include retrieving the recorded signals from memory of the monitoring electronics at a time after removal from coupling to test equipment providing the stimulus and after the battery module has relaxed from the applied stimulus.

An example method 13 of battery testing can include features of any of the preceding example methods and can include calculating Electrochemical Impedance Spectroscopy characteristics of the battery module or the one or more of the batteries based on data from the recorded signals and the stimulus.

An example method 14 of battery testing can include features of any of the preceding example methods and can include applying the stimulus to the battery module to include exciting the battery module with the battery module operable in a car, with the exciting enabled with the car in an on-status; and turning off use of the battery module to include removing the stimulus to the battery module with the turning off of the car.

An example method 15 of battery testing can include features of any of the preceding example methods and can include detecting an anomaly from the recorded signals; or determining a hidden state of the battery module or one or more of the batteries based on the recorded signals and a database that converts observable data to hidden states.

An example method 16 of battery testing can include features of any of the preceding example methods and can include modelling the battery module or one or more of the batteries based on the recorded signals, including creating an electrical model; interrogating the electrical model; generating impedances from the interrogating of the electrical model; and determining a hidden state of the battery module or one or more of the batteries, based on the generated impedances and a database that converts impedances to hidden states.

In an example system method 17, any apparatus associated with the example methods 1 to 16 may further include a machine-readable storage device configured to store instructions as a physical state, wherein the instructions may be used to perform one or more operations of the example methods 1 to 16 and the apparatus.

An example method 18 of battery testing can include features of any of the preceding example methods of battery testing and can include performing functions associated with any features of example systems 1-14 having a structure to measure a battery and any features of example systems associated with the figures herein.

The above detailed description refers to the accompanying drawings that show, by way of illustration and not limitation, various embodiments that can be practiced. These embodiments are described in sufficient detail to enable those skilled in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The above detailed description is, therefore, not to be taken in a limiting sense.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:
1. A method of battery testing, the method comprising:
applying a stimulus to a battery module, the battery module having one or more batteries;

turning off use of the battery module including removing the stimulus to the battery module;

after turning off use of and removing the stimulus to the battery module, autonomously recording signals from the battery module for a battery settling time of one or more hours after removing the stimulus using monitoring electronics attached to the battery module; and outputting the recorded signals from which one or more electrochemical parameters or one or more electrical parameters of the battery module or the one or more batteries arranged in the battery module are calculated using the recorded signals.

2. The method of claim 1, wherein
applying the stimulus to the battery module includes applying the stimulus to the battery module using test equipment; and
turning off use of the battery module including removing the stimulus to the battery module includes removing the stimulus to the battery module from the test equipment.

3. The method of claim 1, wherein autonomously recording signals includes recording voltage, temperature, or impedance of the one or more batteries.

4. The method of claim 1, wherein autonomously recording signals from the battery module for the battery settling time occurs during a period including from turning off use of and removing the stimulus to the battery module to completion of relaxation of the battery module from applying the stimulus.

5. The method of claim 1, wherein the method includes transmitting the recorded signals wirelessly to a receiving device to analyze data from the recorded signals.

6. The method of claim 1, wherein the method includes retrieving the recorded signals from memory of the monitoring electronics at a time after removal from coupling to test equipment providing the stimulus and after the battery module has relaxed from the applied stimulus.

7. The method of claim 1, wherein the method includes calculating Electrochemical Impedance Spectroscopy characteristics of the battery module or the one or more of the batteries based on data from the recorded signals and the stimulus.

8. The method of claim 1, wherein
applying the stimulus to the battery module includes exciting the battery module with the battery module operable in a car, with the exciting enabled with the car in an on-status; and
turning off use of the battery module including removing the stimulus to the battery module with the turning off of the car.

9. The method of claim 1, wherein the method includes:
detecting an anomaly from the recorded signals; or
determining a hidden state of the battery module or one or more of the batteries based on the recorded signals and a database that converts observable data to hidden states.

10. The method of claim 1, wherein the method includes:
modelling the battery module or one or more of the batteries based on the recorded signals, including creating an electrical model;
interrogating the electrical model;
generating impedances from the interrogating of the electrical model; and
determining a hidden state of the battery module or one or more of the batteries, based on the generated impedances and a database that converts impedances to hidden states.

11. A system comprising:
a battery module having one or more batteries;
monitoring electronics attached to the battery module, the monitoring electronics to monitor response of a battery of the battery module to a stimulus applied to the battery; and
a controller configured to perform operations, the operations including:
turning off use of the battery module including removing the stimulus to the battery module;
after turning off use of and removing the stimulus to the battery module, autonomously recording signals from the battery module using the monitoring electronics for a battery settling time period of one or more hours; and
outputting the recorded signals from which one or more electrochemical parameters or one or more electrical parameters of the battery module or the one or more batteries arranged in the battery module are calculated using the recorded signals.

12. The system of claim 11, wherein the system includes:
test equipment to provide the stimulus to the battery.

13. The system of claim 11, wherein autonomously recording signals includes recording voltage, temperature, or impedance of the one or more batteries.

14. The system of claim 11, wherein the controller is operable to autonomously record signals from the battery module during the battery settling time period including from turning off use of and removing the stimulus to the battery module to completion of relaxation of the battery module from applying the stimulus.

15. The system of claim 11, wherein the system includes a transmitter to transmit the recorded signals wirelessly to a receiving device to analyze data from the recorded signals.

16. The system of claim 11, wherein the system includes a processing device configured to perform operations, the operations including:
modelling the battery module or one or more of the batteries based on the recorded signals, including creating an electrical model;
interrogating the electrical model;
generating impedances from the interrogating of the electrical model; and
determining a hidden state of the battery module or one or more of the batteries, based on the generated impedances and a database that converts impedances to hidden states.

17. A system comprising:
a battery module having one or more batteries;
a means to monitor a response of a battery of the battery module to a stimulus applied to the battery;
a means to autonomously record signals from the battery module in response to the means to monitor the response of the battery identifying the turning off of the battery module including removal of the stimulus to the battery and for a battery settling time period of one or more hours; and
a means to output the recorded signals from which one or more electrochemical parameters or one or more electrical parameters of the battery module or the one or more batteries arranged in the battery module are calculated using the recorded signals.

18. The system of claim 17, wherein autonomously recording signals from the battery module occurs during the battery settling time period including from turning off use of and removing the stimulus to the battery to completion of relaxation of the battery from applying the stimulus.

19. The system of claim 17, wherein the system includes a means to process the recorded signals, with the means to process the recorded signals being operable to provide, to a display, a characterization of health of the battery including, in response to a determination of battery degradation, an alert of the battery degradation.

20. The system of claim 17, wherein the system includes a means to process the recorded signals, with the means to process the recorded signals being operable to provide, to a display, a quality grade of the battery module including, in response to a determination of an anomaly associated with the battery module, an identification of the battery module being an anomalous battery module.

* * * * *